(12) United States Patent
Hattori et al.

(10) Patent No.: US 12,354,900 B2
(45) Date of Patent: Jul. 8, 2025

(54) CERAMIC MATERIAL HAVING HIGH RESISTIVITY AND HIGH CORROSION RESISTANCE, AND WAFER PLACEMENT TABLE

(71) Applicant: NGK Insulators, Ltd., Nagoya (JP)

(72) Inventors: Akiyoshi Hattori, Nagoya (JP); Koji Ueda, Nagoya (JP); Hitoshi Nishio, Shizuoka (JP); Tomohisa Mizoguchi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 164 days.

(21) Appl. No.: 18/169,380

(22) Filed: Feb. 15, 2023

(65) Prior Publication Data

US 2023/0298921 A1 Sep. 21, 2023

(30) Foreign Application Priority Data

Mar. 17, 2022 (JP) .................. 2022-042036

(51) Int. Cl.
| | |
|---|---|
| *H01L 21/683* | (2006.01) |
| *C01B 21/082* | (2006.01) |
| *C04B 35/581* | (2006.01) |
| *H01J 37/32* | (2006.01) |

(52) U.S. Cl.
CPC ...... *H01L 21/6833* (2013.01); *C01B 21/0825* (2013.01); *C04B 35/581* (2013.01); *C01P 2002/72* (2013.01); *C01P 2006/40* (2013.01); *C01P 2006/80* (2013.01); *C04B 2235/3232* (2013.01); *C04B 2235/3869* (2013.01); *C04B 2235/9669* (2013.01); *H01J 37/32715* (2013.01); *H01J 2237/2007* (2013.01)

(58) Field of Classification Search
CPC ............ H01L 21/6833; C01B 21/0825; C04B 35/581; C01P 2002/72; H01J 37/32715; H01J 2237/2007
See application file for complete search history.

(56) References Cited

U.S. PATENT DOCUMENTS

| | | |
|---|---|---|
| 2002/0193229 A1 | 12/2002 | Miyahara |
| 2006/0073349 A1 | 4/2006 | Aihara et al. |
| 2007/0215840 A1 | 9/2007 | Yoshikawa et al. |
| 2008/0174930 A1 | 7/2008 | Hattori et al. |

(Continued)

FOREIGN PATENT DOCUMENTS

| | | |
|---|---|---|
| CN | 101723674 A | 6/2010 |
| CN | 103180266 A | 6/2013 |

(Continued)

OTHER PUBLICATIONS

AN Chinese Office Action (Application No. 202211703929.1) dated Feb. 29, 2024 (with English translation) (15 pages).

(Continued)

*Primary Examiner* — Jared Fureman
*Assistant Examiner* — Samantha L Faubert
(74) *Attorney, Agent, or Firm* — BURR PATENT LAW, PLLC

(57) ABSTRACT

A ceramic material that has a high resistivity and high corrosion resistance according to the present invention contains magnesium-aluminum oxynitride and has a carbon content of 0.005 to 0.275 mass %.

8 Claims, 4 Drawing Sheets

(56) References Cited

U.S. PATENT DOCUMENTS

| | | |
|---|---|---|
| 2010/0104892 A1 | 4/2010 | Kobayashi et al. |
| 2012/0231243 A1 | 9/2012 | Watanabe et al. |
| 2013/0220988 A1* | 8/2013 | Kondo .................... H05B 1/00 |
| | | 219/444.1 |
| 2013/0229746 A1 | 9/2013 | Aikawa et al. |
| 2018/0226285 A1* | 8/2018 | Hanamachi ......... H01L 21/6831 |
| 2020/0002231 A1* | 1/2020 | Ogawa .................. C04B 35/117 |
| 2020/0207666 A1* | 7/2020 | Wang .................... C04B 35/581 |

FOREIGN PATENT DOCUMENTS

| | | |
|---|---|---|
| CN | 109053192 A | 12/2018 |
| JP | 2003-234386 A | 8/2003 |
| JP | 2006-128603 A | 5/2006 |
| JP | 2007-254164 A | 10/2007 |
| JP | 2008-098626 A | 4/2008 |
| JP | 2008-115065 A | 5/2008 |
| JP | 5680645 B2 | 3/2015 |
| TW | 486452 B | 5/2002 |
| TW | 200811989 A | 3/2008 |

OTHER PUBLICATIONS

Guotian Ye, et al., "Synthesis and Oxidation Behavior of MgAlON Prepared for Different Starting Materials," *Journal of the American Ceramic Society*, vol. 93, No. 2 (2010), pp. 322-325 (4 pages).

Taiwanese Office Action dated Dec. 5, 2023 (Application No. 112105271).

Japanese Office Action (with English translation) dated Sep. 10, 2024 (Application No. 2022-042036).

Taiwanese Office Action dated May 2, 2024 (Application No. 112105271).

* cited by examiner

CERAMIC MATERIAL HAVING HIGH RESISTIVITY AND HIGH CORROSION RESISTANCE, AND WAFER PLACEMENT TABLE

BACKGROUND OF THE INVENTION

1. Field of the Invention

The present invention relates to a ceramic material that has a high resistivity and high corrosion resistance, and a wafer placement table.

2. Description of the Related Art

In semiconductor manufacturing apparatuses used in a dry process, plasma coating, etc., of semiconductor manufacturing, highly reactive halogen plasma such as F and Cl plasma is used for etching and cleaning. Thus, components assembled into such semiconductor manufacturing apparatuses are required to have high corrosion resistance. As described in PTL 1, a ceramic material having a magnesium-aluminum oxynitride phase as the main phase is known as a material having high corrosion resistance. This ceramic material can endure for a long time highly reactive halogen plasma used in semiconductor manufacturing processes.

CITATION LIST

Patent Literature

PTL 1: JP 5680645 B

SUMMARY OF THE INVENTION

In recent years, the process temperature has become increasingly higher (500° C. or more) in order to form high-quality films. Thus, not only the sufficient corrosion resistance at high temperatures but also the ability to electrostatically adsorb a wafer at high temperatures is required.

The present invention has been made to address such issues, and a main object thereof is to increase the volume resistivity at high temperatures as well as achieving sufficient corrosion resistance at high temperatures.

A ceramic material having a high resistivity and high corrosion resistance according to the present invention contains: magnesium-aluminum oxynitride, and has a carbon content of 0.005 to 0.275 mass %.

According to this ceramic material which has an appropriate carbon content, the volume resistivity at high temperatures can be increased while achieving sufficient corrosion resistance at high temperatures.

A wafer placement table according to the present invention is equipped with: a ceramic substrate made of the ceramic material described above, the ceramic substrate having an upper surface onto which a wafer can be placed; and an electrode disposed inside the ceramic substrate, or is equipped with a ceramic substrate made of the ceramic material described above, the ceramic substrate having an upper surface onto which a wafer can be placed; a highly heat-conductive substrate that is attached to a lower surface of the ceramic substrate and that has a higher heat conductivity than the ceramic substrate; an electrode that is disposed inside the ceramic substrate, inside the highly heat-conductive substrate, or between the ceramic substrate and the highly heat-conductive substrate; and a resistance heating element that is disposed inside the highly heat-conductive substrate and under the electrode.

According to the wafer placement table described heretofore, since the ceramic substrate is made of the aforementioned ceramic material, the same effects as the aforementioned ceramic material, for example, sufficient corrosion resistance at high temperatures and a higher volume resistivity at high temperatures, can be achieved. Here, the "electrode" may be, for example, an electrostatic electrode, a heater electrode (resistance heating element), or a radiofrequency (RF) electrode for generating plasma.

DETAILED DESCRIPTION OF THE INVENTION

Figure 1:
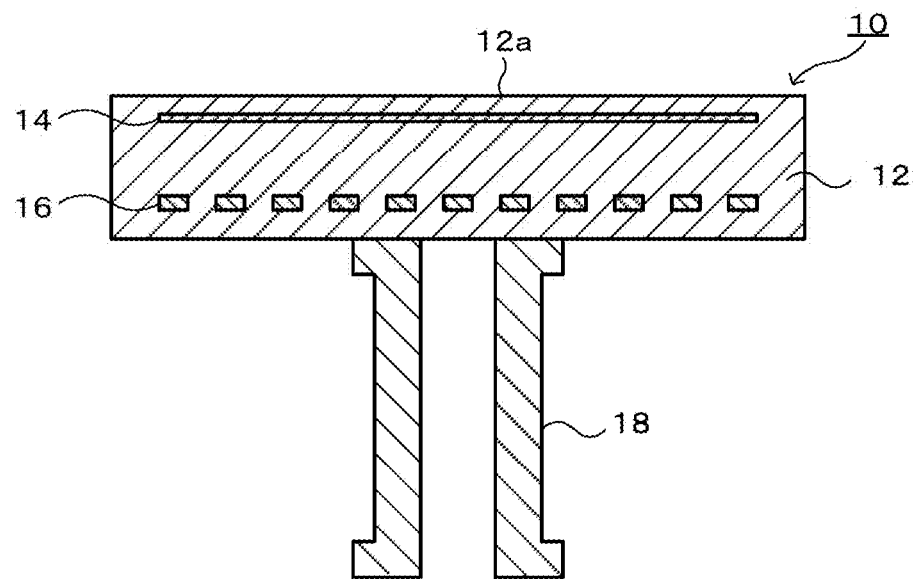
FIG. 1 is a vertical cross-sectional view of a wafer placement table 10.

Preferable embodiments of the present invention will now be described with reference to the drawings. FIGS. 1 to 4 are vertical cross-sectional views of wafer placement tables 10 to 40. In this description, the terms "upper" and "lower" do not indicate absolute positional relationships but relative positional relationships. Thus, depending on the orientation of the wafer placement tables 10 to 40, "upper" and "lower" may respectively mean "lower" and "upper", "left" and "right", or "front" and "rear". In addition, the term "to" indicating numerical ranges in this description is used to include the figures preceding and following "to" as the lower limit and the upper limit, respectively.

A ceramic material having a high resistivity and high corrosion resistance according to this embodiment contains magnesium-aluminum oxynitride, and has a carbon content of 0.005 to 0.275 mass %. As long as the carbon content is in this range, the volume resistivity at high temperatures can be increased while achieving sufficient corrosion resistance at high temperatures. For example, when this ceramic material is used as a ceramic substrate having a wafer placement surface and a built-in electrostatic electrode, a wafer can be electrostatically adsorbed at high temperatures, and the flow of leakage current between the wafer and the electrode during high-temperature wafer processing can be reduced. In addition, when this ceramic material is used as a ceramic substrate having a built-in heater electrode (resistance heating element) or RF electrode, the flow of leakage current between the wafer and the electrode during high-temperature wafer processing can be reduced. When the carbon content is less than 0.005 mass % or more than 0.275 mass %, the volume resistivity at 500° C. decreases. The carbon content is preferably 0.005 to 0.21 mass %. The ceramic material of this embodiment preferably contains, as a main phase, magnesium-aluminum oxynitride. Here, the main phase refers to a phase that accounts for the largest fraction of the total.

The ceramic material of this embodiment preferably has a volume resistivity at 500° C. of $1 \times 10^9$ Ωcm or more. As long as the volume resistivity at 500° C. is $1 \times 10^9$ Ωcm or more, the flow of leakage current between the wafer and the electrode during high-temperature wafer processing can be sufficiently reduced when this ceramic material is used as a ceramic substrate that has a wafer placement surface and a built-in electrode. Moreover, when this ceramic material is used in an electrostatic chuck, the wafer can be reliably electrically adsorbed at high temperatures due to the Johnsen-Rahbek effect. The volume resistivity at 500° C. is preferably $5 \times 10^{11}$ Ωcm or less. In this manner, when this ceramic material is used in an electrostatic chuck, the wafer chucking-dechucking responsiveness can be improved.

The ceramic material of this embodiment may contain titanium. When titanium is contained, the ceramic material exhibits a black color. Thus, color unevenness in the ceramic material can be made less conspicuous. The titanium content may be set such that the corrosion resistance is not degraded and the volume resistivity at 500° C. does not deviate from the aforementioned range, and, for example, may be set within a range of 0.1 to 1 mass % on an oxide basis.

The ceramic material of this embodiment preferably has, as a main phase, a magnesium-aluminum oxynitride phase that has a peak appearing at 2θ=47 to 50° (preferably 47 to 49°) in XRD using Cu Kα radiation. Such a ceramic material is preferable since the corrosion resistance against halogenated plasma is comparable or superior to spinel. This main phase is preferably coincident with the peak of the magnesium-aluminum oxynitride disclosed in PTL 1 (Japanese Patent No. 5680645). Note that the peak of the magnesium-aluminum oxynitride disclosed in PTL 1 is not coincident with the peak of MgAlON disclosed in, for example, reference document 1 (J. Am. Ceram. Soc., 93[2] 322-325 (2010)) or reference document 2 (Japanese Unexamined Patent Publication No. 2008-115065). In general, these MgAlON are known to contain dissolved N components in spinel, and are considered to have crystal structures different from the magnesium-aluminum oxynitride disclosed in PTL 1.

Next, a production example of the ceramic material of this embodiment is described. The ceramic material of this embodiment can be produced by molding a mixed powder of magnesium oxide, alumina, aluminum nitride, and a carbon source, and firing the molded powder. For example, 5 mass % or more and 60 mass % or less of magnesium oxide, 60 mass % or less of alumina, and 90 mass % or less of aluminum nitride may be weighed and mixed with a carbon source, and the resulting mixture may be molded and then fired. An organic binder, an organic dispersing agent, or a carbon powder may be added as the carbon source. The amount of the carbon source added may be set such that the carbon content of the ceramic material after firing is 0.005 to 0.2 mass %. Alternatively, degreasing may be conducted prior to firing in order to adjust the carbon content of the ceramic material after firing to 0.005 to 0.2 mass %. In such a case, the carbon content may be adjusted by controlling the degreasing temperature. The degreasing temperature is preferably set within the range of, for example, 300 to 600° C. Molding may involve, for example, granulating a slurry of a mixed powder to form granules and powder-pressing the resulting granules, or may involve forming a slurry of a mixed powder into green sheets by a doctor blade method. The pressure during molding is not particularly limited and may be set to any pressure appropriate for retaining the shape. The firing temperature is preferably 1750° C. or higher and more preferably 1800 to 1950° C. Furthermore, hot-press firing is preferably employed as the firing, and the press pressure during hot-press firing is preferably set to 50 to 300 kgf/cm². The atmosphere during firing is preferably an atmosphere that does not affect firing of the oxide raw materials, and is preferably, for example, an inert atmosphere such as a nitrogen atmosphere, an argon atmosphere, or a helium atmosphere. The pressure during molding is not particularly limited and may be set to any pressure appropriate for retaining the shape.

Next, the wafer placement tables 10 to 40 are described with reference to the drawings.

As illustrated in FIG. 1, the wafer placement table 10 is an electrostatic chuck heater equipped with an electrostatic electrode 14 placed inside a ceramic substrate 12, and a resistance heating element 16 under the electrostatic electrode 14 and inside the ceramic substrate 12.

The ceramic substrate 12 is obtained by forming the aforementioned ceramic material into a disk shape, and the upper surface thereof is a wafer placement surface 12a on which a wafer can be placed.

The electrostatic electrode 14 is a disk-shaped metal plate or metal mesh, and is arranged to be parallel to the wafer placement surface 12a. The electrostatic electrode 14 may take a form of a foil, a punched metal, a printed electrode, or the like instead of the disk-shaped metal plate or mesh. Here, "parallel" not only refers to the case where the electrode is perfectly parallel but also to the case where the deviation from the perfectly parallel arrangement is within an allowable margin of error (for example, tolerance). Of the ceramic substrate 12, the portion that lies above the electrostatic electrode 14 functions as a dielectric layer. The wafer placed on the wafer placement surface 12a is adsorbed onto the wafer placement surface 12a due to the Johnsen-Rahbek effect (electrostatic force) upon application of DC voltage to the electrostatic electrode 14. Examples of the material used in the electrostatic electrode 14 include W, Mo, W—Mo alloys, and carbides thereof.

When the ceramic substrate 12 is viewed from above, the resistance heating element 16 is laid out from one end to the other end in a one-stroke pattern throughout the entirety, and generates heat when current is fed between these ends. For example, a wire-shaped conductor bent into a wound body can be used as the resistance heating element 16. The wire diameter of the resistance heating element 16 is preferably about 0.3 mm to 0.5 mm, and when the resistance heating element 16 has a coil shape, the winding diameter is preferably about 2 mm to 4 mm with a pitch of preferably about 1 mm to 7 mm. Here, the "winding diameter" refers to the inner diameter of the coil constituting the resistance heating element 16. The resistance heating element 16 may take any shape other than the coil shape, for example, a ribbon shape, a mesh shape, a coil-spring shape, a sheet shape, or a printed electrode. Examples of the material used in the resistance heating element 16 include W, Mo, W—Mo alloys, and carbides thereof.

A cylindrical shaft 18 is joined to a lower surface of the wafer placement table 10. Joining may be achieved by, for example, sintering or with a bond (for example, an inorganic bond). The shaft 18 preferably has a linear thermal expansion coefficient the same as or close to that of the ceramic substrate 12. Preferably, AlN-YAG is used as the material for the shaft 18. YAG stands for yttrium aluminum garnet ($Y_3Al_5O_{12}$). AlN-YAG may contain titanium, and the content thereof may be, for example, 0.1 to 1 mass % on an oxide basis. Adding titanium blackens the AlN-YAG, and thus color unevenness of AlN-YAG can be made less conspicuous.

According to the wafer placement table 10 described heretofore, since the ceramic substrate 12 is made of the aforementioned ceramic material, the same effects as the aforementioned ceramic material, for example, sufficient corrosion resistance at high temperatures and a higher volume resistivity at high temperatures, can be achieved. Moreover, when a wafer is electrostatically adsorbed at high temperature or when a wafer is processed at high temperatures, the flow of leakage current between the wafer and the electrostatic electrode 14 can be reduced. In addition, the flow of leakage current between the wafer and the resistance heating element 16 during high-temperature wafer processing can be reduced.

Figure 2:
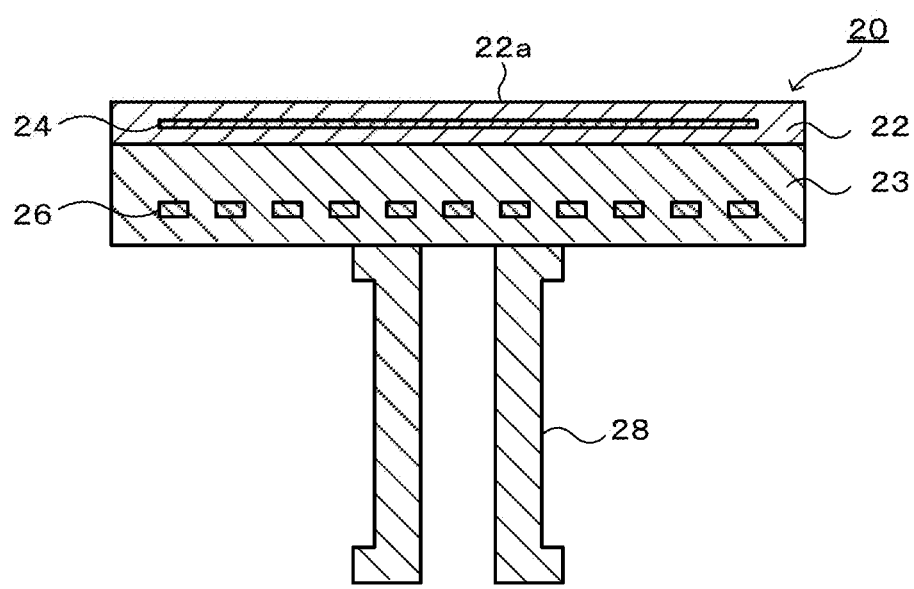
FIG. 2 is a vertical cross-sectional view of a wafer placement table 20.

The wafer placement table 20 illustrated in FIG. 2 is an electrostatic chuck heater in which a highly heat-conductive substrate 23 having a built-in resistance heating element 26 is jointed to a lower surface of a ceramic substrate 22 having a built-in electrostatic electrode 24. Joining may be achieved by, for example, sintering or with a bond (for example, an inorganic bond).

The ceramic substrate 22 is obtained by forming the aforementioned ceramic material into a disk shape, and the upper surface thereof is a wafer placement surface 22a on which a wafer can be placed. Since the electrostatic electrode 24 is identical to the electrostatic electrode 14 described above, the description thereof is omitted.

A substrate that has a heat conductivity higher than that of the ceramic substrate 22 and a linear thermal expansion coefficient the same as or close to that of the ceramic substrate 22 is used as the highly heat-conductive substrate 23. AlN-YAG may contain titanium, and the content thereof may be, for example, 0.1 to 1 mass % on an oxide basis. Adding titanium blackens the AlN-YAG, and thus color unevenness of AlN-YAG can be made less conspicuous.

Since the resistance heating element 26 is identical to the aforementioned resistance heating element 16, the description thereof is omitted.

A cylindrical shaft 28 is joined to a lower surface of the wafer placement table 20. Since the shaft 28 is identical to the shaft 18 described above, the description thereof is omitted.

According to the wafer placement table 20 described heretofore, since the ceramic substrate 22 is made of the aforementioned ceramic material, the same effects as the aforementioned ceramic material, for example, sufficient corrosion resistance at high temperatures and a higher volume resistivity at high temperatures, can be achieved. Moreover, when a wafer is electrostatically adsorbed at high temperature or when a wafer is processed at high temperatures, the flow of leakage current between the wafer and the electrostatic electrode 14 can be reduced.

In addition, in the wafer placement table 20, the highly heat-conductive substrate 23 is joined to the lower surface of the ceramic substrate 22, and it is thus easier to even out the temperature of the wafer placed on the wafer placement surface 22a compared to the wafer placement table 10.

Furthermore, since the highly heat-conductive substrate 23 has a thermal expansion coefficient the same as or close to that of the ceramic substrate 22, the highly heat-conductive substrate 23 does not easily separate from the ceramic substrate 22 despite repeated increase and decrease in temperatures.

Figure 3:
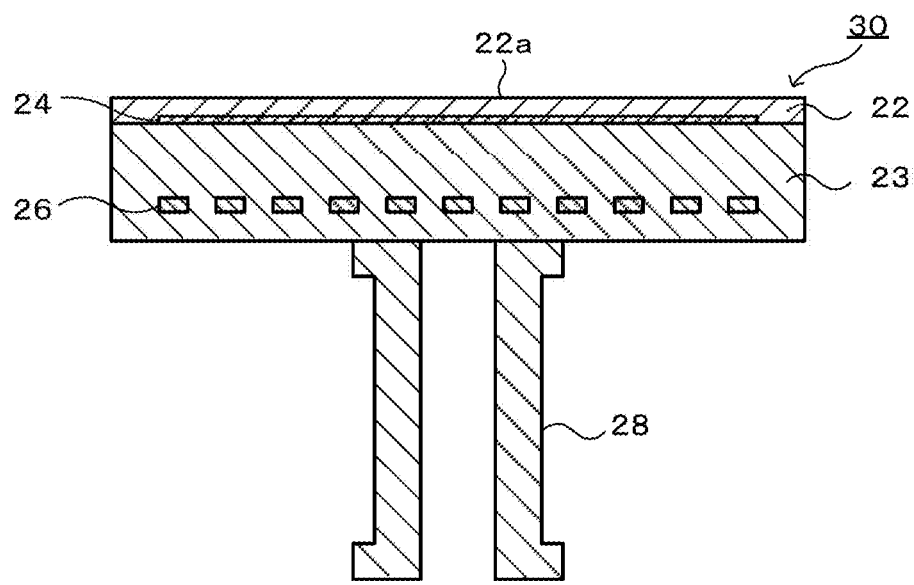
FIG. 3 is a vertical cross-sectional view of a wafer placement table 30.

The wafer placement table 30 illustrated in FIG. 3 is identical to the wafer placement table 20 except that the electrostatic electrode 24 is disposed at the interface between the ceramic substrate 22 and the highly heat-conductive substrate 23. The wafer placement table 30 also has the same effects as the wafer placement table 20.

Figure 4:
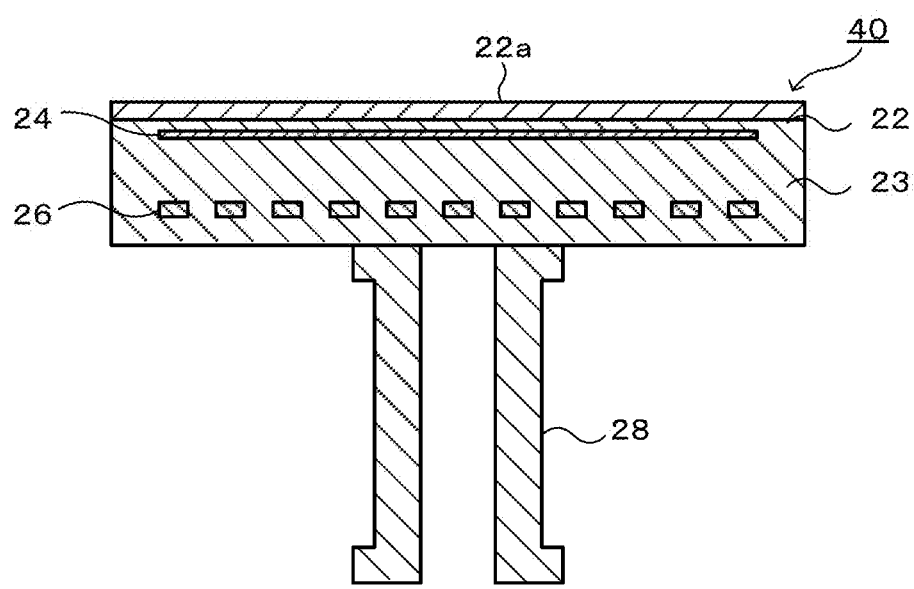
FIG. 4 is a vertical cross-sectional view of a wafer placement table 40.

The wafer placement table 40 illustrated in FIG. 4 is identical to the wafer placement table 20 except that the electrostatic electrode 24 is disposed in the highly heat-conductive substrate 23 but not in the ceramic substrate 22. The resistance heating element 26 is under the electrostatic electrode 24. The wafer placement table 40 also has the same effects as the wafer placement table 20. However, in the wafer placement table 40, the dielectric layer (the portion that lies above the electrostatic electrode 24) is constituted by the ceramic substrate 22 and the highly heat-conductive substrate 23; thus, the wafer adsorbing force of the wafer placement tables 10 to 30, which each have a dielectric layer constituted solely by the ceramic substrate 22, is easier to adjust than with the wafer placement table 40.

Note that the present invention is in no way limited by the aforementioned embodiments, and can be naturally implemented in a variety of modes without departing from the technical scope of the present invention.

For example, the wafer placement tables 10 to 40 having built-in electrostatic electrodes 14 and 24 are described as examples; however, the electrostatic electrodes 14 and 24 do not have to be built-in. In such a case also, the flow of leakage current between the wafer and the resistance heating element 16 or 26 can be reduced. An RF electrode may be built-in instead of or in addition to the electrostatic electrode 14 or 24, or the electrostatic electrode 14 or 24 may double as an RF electrode.

Alternatively, the outer periphery (upper surface, side surfaces, and lower surface) of the highly heat-conductive substrate 23 can be wrapped in the aforementioned ceramic material. In this manner, the corrosion resistance of the side surfaces and the bottom surface can be improved.

EXAMPLES

Examples of the present invention will now be described. Experimental Examples 2 to 6, 9 to 11, 13 to 15, and 17 to 19 correspond to the examples of the present invention. It should be understood that the following examples do not limit the present invention in any way.

Experimental Examples 1 to 7

Preparation

In Experimental Example 1, a MgO raw material, an $Al_2O_3$ raw material, and an AlN raw material were weighed in mass % indicated in Table 1, and wet-mixed for 4 hours in a nylon pot with alumina balls having a diameter of 5 mm by using isopropyl alcohol as a solvent. After mixing, the slurry was taken out and dried under a nitrogen stream at 110° C. The dried product was passed through a 30-mesh screen to obtain a prepared powder.

In Experimental Example 2, a MgO raw material, an $Al_2O_3$ raw material, and an AlN raw material were weighed in mass % indicated in Table 1, and wet-mixed for 4 hours in a trommel with alumina balls by adding 1.0 mass % of an acrylic binder and 0.1 mass % of a polycarboxylic acid dispersing agent and by using isopropyl alcohol as a solvent so as to obtain a raw material slurry. The obtained raw material slurry was spray-dried with a spray drier to obtain granules. The obtained granules were heated in air at 500° C. for 24 hours to obtain partially degreased granules.

In Experimental Example 3, granules were obtained as in Experimental Example 2 except that partial degreasing was performed by heating in air at 500° C. for 5 hours.

In Experimental Example 4, granules were obtained as in Experimental Example 2 except that 1.5 mass % of an acrylic binder and 0.5 mass % of a polycarboxylic acid dispersing agent were added and that partial degreasing was performed by heating in air at 450° C. for 5 hours.

In Experimental Example 5, granules were obtained as in Experimental Example 4 except that degreasing was omitted.

In Experimental Example 6, a MgO raw material, an $Al_2O_3$ raw material, and an AlN raw material were weighed in mass % indicated in Table 1, and wet-mixed for 4 hours in a nylon pot with alumina balls having a diameter of 5 mm by adding 0.3 mass % of carbon powder and by using isopropyl alcohol as a solvent. After mixing, the slurry was taken out and dried under a nitrogen stream at 110° C. The dried product was passed through a 30-mesh screen to obtain a prepared powder.

In Experimental Example 7, granules were obtained as in Experimental Example 6 except that 0.42 mass % of the carbon powder was added.

Molding

The prepared powder or granules were uniaxially pressed at a pressure of 100 kgf/cm² into a disk-shaped molded body having a diameter of 35 mm and a thickness of about 10 mm, and the disk-shaped molded body was placed in a graphite mold for firing.

Firing

The disk-shaped molded body was hot-press fired into a ceramic substrate. In hot-press firing, the press pressure was 200 kgf/cm², and firing was performed at a firing temperature (maximum temperature) indicated in Table 1. A $N_2$ atmosphere was retained until the firing was completed. The time for which the firing temperature was retained was 4 hours.

[Evaluation]

(1) Crystal Phase Evaluation

Figure 5:
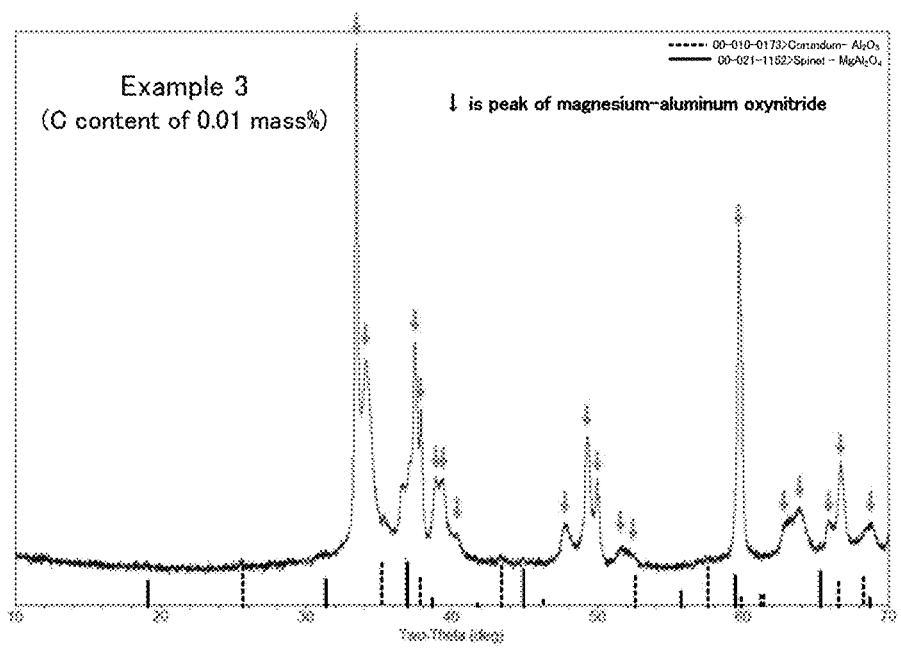
FIG. 5 is an XRD chart of Example 3.
Figure 6:
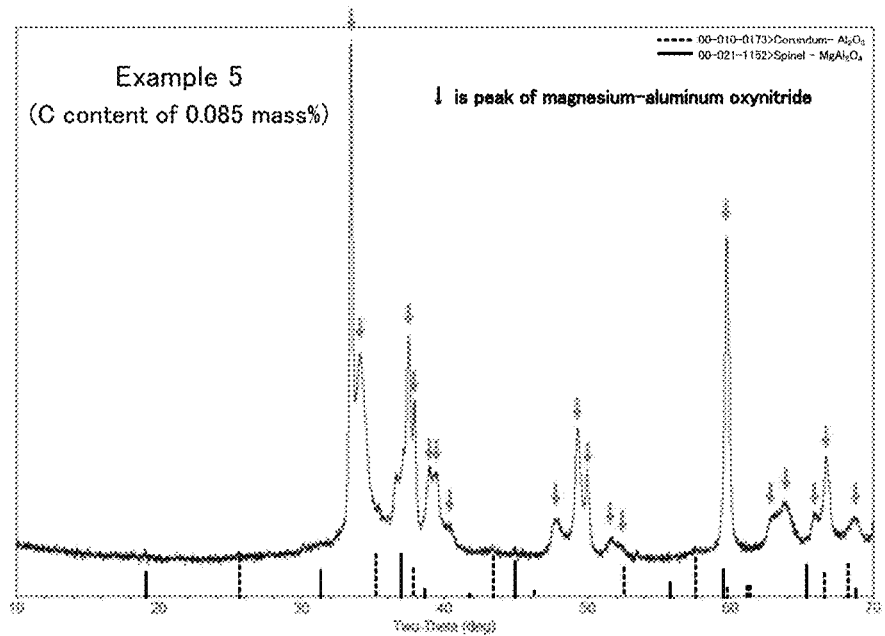
FIG. 6 is an XRD chart of Example 5.

Each of the ceramic substrates obtained in Experimental Examples 1 to 7 was crushed in a mortar, and the crystal phases were identified with an X-ray diffractometer. The measurement conditions were Cu Kα, 40 kV, 40 mA, 2θ=5 to 70°, and a sealed tube-type X-ray diffractometer (D8 ADVANCE produced by Bruker AXS) was used. As a result, in all of Experimental Examples 1 to 7, the main phase was magnesium-aluminum oxynitride (a peak was found at 2θ=47 to 49°). This main phase was coincident with the peak of the magnesium-aluminum oxynitride identified in PTL 1. FIGS. 5 and 6 are XRD charts of representative examples (Experimental Examples 3 and 5).

(2) Carbon (C) Content

The C content was measured in accordance with the total carbon measurement method recited in JIS R 1616:2007. Specifically, a sample was burned along with a combustion improver in an oxygen stream by radio-frequency heating, generated carbon dioxide (and carbon monoxide) and oxygen were fed to an infrared analyzer, and the changes in infrared absorption was measured to determine the C content. The C contents of the ceramic substrates obtained in Experimental Examples 1 to 7 are indicated in Table 1. The C contents in Experimental Examples 1 and 7 were, respectively, 0.002 mass % and 0.30 mass %, and the C contents in Experimental Examples 2 to 6 were 0.005 to 0.21 mass %. Experimental Example 1 was an example of PTL 1, and the C content in Experimental Example 1 was the value when a carbon source was not intentionally added (the C content as an impurity).

(3) Volume Resistivity (500° C.)

Figure 7:
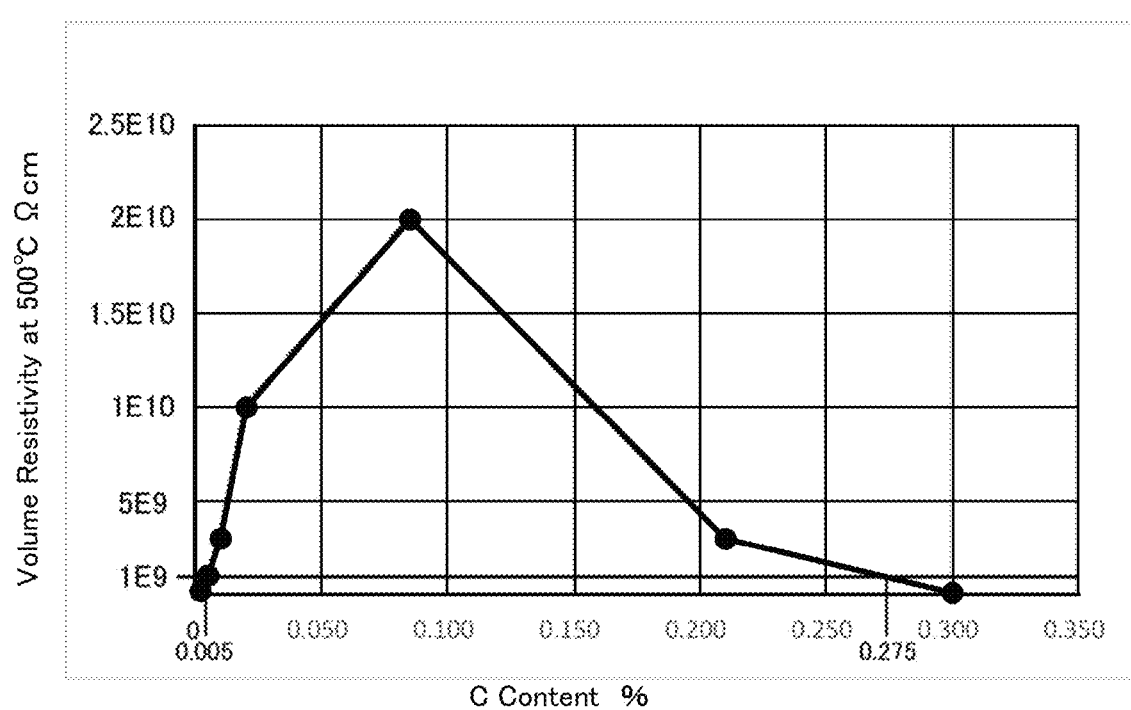
FIG. 7 is a graph illustrating the relationship between the C content and the volume resistivity at 500° C.

The volume resistivity was measured in accordance with JIS-C 2141 in air at 500° C. The shape of the test piece was 50 mm in diameter×(0.5 to 1 mm), and the electrodes were formed by using silver so that a main electrode had a diameter of 20 mm, a guard electrode had an inner diameter of 30 mm and an outer diameter of 40 mm, and an application electrode had a diameter of 40 mm. The application voltage was set to 500 V/mm, the current value 3 minutes after starting application of the voltage was read out, and the room-temperature volume resistivity was calculated from the obtained current value. The volume resistivities of the ceramic substrates obtained in Experimental Examples 1 to 7 are indicated in Table 2. For the volume resistivities indicated in Table 2, "E8" means $10^8$, and "E10" means $10^{10}$. The volume resistivity at 500° C. was $1\times10^9$ Ωcm or higher in Experimental Examples 2 to 6, but the value in Experimental Examples 1 and 7 was lower than this. The relationship between the C content and the volume resistivity at 500° C. is illustrated in FIG. 7. The graph in FIG. 7 indicates that the C content that gives a volume resistivity at 500° C. of $1\times10^9$ Ωcm or more is 0.005 to 0.275 mass %. Furthermore, a carbon content of 0.011 to 0.19 mass % is yet more preferable since the volume resistivity becomes $5\times10^9$ Ωcm or more.

(4) Heat Conductivity (Room Temperature)

The heat conductivity was measured by a laser flash method. The room-temperature heat conductivities of the ceramic substrates obtained in Experimental Examples, 2, 3, 5, and 6 are indicated in Table 2.

(5) Average Linear Thermal Expansion Coefficient (40 to 1000° C.)

The average linear thermal expansion coefficient at 1000° C. was measured with a dilatometer (produced by Bruker AXS) in a nitrogen atmosphere at 40 to 1000° C. The average linear thermal expansion coefficients at 1000° C. of the ceramic substrates obtained in Experimental Examples, 2, 3, 5, and 6 are indicated in Table 2.

(6) Etching Rate

The etching rates of the ceramic substrates obtained in Experimental Examples 1, 3, 5, and 6 are indicated in Table 2. Specifically, the surface of each material was mirror-polished, and subjected to a corrosion resistance test under the following conditions using an ICP plasma corrosion-resistance tester. Then the step difference between the masked surface and the exposed surface measured by a step gauge was divided by the testing time to obtain the etching rate of each material. The results revealed that Experimental Examples 3, 5, and 6 had corrosion resistance comparable or superior to Experimental Example 1 (the example product of PTL 1 that has corrosion resistance comparable or superior to spinel).

ICP: 800 W, bias: 300 W, introduced gas: $NF_3$/Ar=75/100 sccm 13 Pa, exposure time: 5 h, sample temperature: 550° C.

TABLE 1

| | Raw Material Mixture | | | | C Content |
| --- | --- | --- | --- | --- | --- |
| | MgO (mass %) | $Al_2O_3$ (mass %) | AlN (mass %) | Firing Temperature (° C.) | in Sintered Body (mass %) |
| Example 1 | 9.6 | 19.4 | 71.2 | 1900 | 0.002 |
| Example 2 | | | | | 0.005 |
| Example 3 | | | | | 0.010 |
| Example 4 | | | | | 0.020 |
| Example 5 | | | | | 0.085 |

TABLE 1-continued

| | Raw Material Mixture | | | | C Content |
|---|---|---|---|---|---|
| | MgO (mass %) | Al$_2$O$_3$ (mass %) | AlN (mass %) | Firing Temperature (° C.) | in Sintered Body (mass %) |
| Example 6 | | | | | 0.21 |
| Example 7 | | | | | 0.30 |
| Example 8 | 18.6 | 27.5 | 54.0 | 1800 | 0.002 |
| Example 9 | | | | | 0.03 |
| Example 10 | | | | | 0.091 |
| Example 11 | | | | | 0.22 |
| Example 12 | 27.6 | 32.8 | 39.6 | 1800 | 0.002 |
| Example 13 | | | | | 0.04 |
| Example 14 | | | | | 0.090 |
| Example 15 | | | | | 0.22 |
| Example 16 | 33.9 | 22.3 | 43.8 | 1800 | 0.002 |
| Example 17 | | | | | 0.03 |
| Example 18 | | | | | 0.087 |
| Example 19 | | | | | 0.23 |

TABLE 2

| | Main Phase of Sintered Body | C Content in Sintered Body (mass %) | Volume Resistivity at 500° C. (Ωcm) | Room-temperature Heat Conductivity (W/m · K) | Thermal Expansion Coefficient at 1000° C. (×10$^{-6}$/K) | Etching Rate (μm/h) |
|---|---|---|---|---|---|---|
| Example 1 | Mg—Al—O—N* | 0.002 | 2E8 | — | — | 0.34 |
| Example 2 | | 0.005 | 1E9 | 8 | 6.1 | — |
| Example 3 | | 0.010 | 3E9 | 8 | 6.1 | 0.32 |
| Example 4 | | 0.020 | 1E10 | — | — | — |
| Example 5 | | 0.085 | 2E10 | 8 | 6.1 | 0.33 |
| Example 6 | | 0.21 | 3E9 | 8 | 6.1 | 0.32 |
| Example 7 | | 0.30 | 9E7 | — | — | — |

*Mg—Al—O—N: Magnesium-aluminum oxynitride (XRD: Peak is found at 2θ = 47 to 49°)

Experimental Examples 8 to 19

In Experimental Examples 8 to 19, a MgO raw material, an Al$_2$O$_3$ raw material, and an AlN raw material were weighed in mass % indicated in Table 1, and a prepared powder or granules were obtained, molded, and fired into ceramic substrates as in Experimental Examples 1 to 7. The C contents of the ceramic substrates obtained are indicated in Table 1. The C contents of Experimental Examples 8, 12, and 16 are each a value observed when a carbon source was not intentionally added (the C content as an impurity).

Experimental Example 20

Experimental Example 20 is one example of an AlN-YAG highly heat-conductive substrate. First, an AlN raw material, an Y$_2$O$_3$ raw material, an Al$_2$O$_3$ raw material, and a TiO$_2$ raw material were weighed, respectively, in 74.5 mass %, 15 mass %, 10 mass %, and 0.5 mass %, and wet-mixed for 4 hours in a nylon pot with alumina balls having a diameter of 5 mm by using isopropyl alcohol as a solvent. After mixing, the slurry was taken out and dried under a nitrogen stream at 110° C. The dried product was passed through a 30-mesh screen to obtain a prepared powder. Molding and firing were performed on this prepared powder as in Experimental Example 1 to obtain a disk-shaped highly heat-conductive substrate. The XRD spectrum of this highly heat-conductive substrate was analyzed, and the main phase was found to be AlN-YAG. The color of the highly heat-conductive substrate was black. The volume resistivity at 500° C. of the obtained highly heat-conductive substrate was 5×10$^9$ Ωcm, the room-temperature heat conductivity was 81 W/m·K, and the thermal expansion coefficient at 40 to 1000° C. was 6.1×10$^{-6}$/K. In other words, the heat conductivity was about 10 times those of Experimental Examples 2, 3, 5, and 6, and the thermal expansion coefficient was comparable to those of Experimental Examples 2, 3, 5, and 6. Experimental Example 20 can be used as the shaft 28 of the wafer placement tables 10 to 40 or the highly heat-conductive substrate 23 of the wafer placement tables 20 to 40.

The present application claims priority from Japanese Patent Application No. 2022-042036, filed on Mar. 17, 2022, the entire contents of which are incorporated herein by reference.

What is claimed is:

1. A ceramic material that has a high resistivity and high corrosion resistance, the ceramic material comprising:
   a magnesium-aluminum oxynitride phase as a main phase,
   wherein the ceramic material has a carbon content of 0.005 to 0.275 mass %.

2. The ceramic material according to claim 1,
   wherein the ceramic material has a volume resistivity at 500° C. of 1×10$^9$ Ωcm or more.

3. The ceramic material according to claim 1, comprising: titanium.

4. The ceramic material according to claim 1,
   wherein the magnesium-aluminum oxynitride phase as the main phase has a peak appearing at least at 2θ=47 to 50° in XRD using Cu Kα radiation.

5. A wafer placement table comprising:
   a ceramic substrate made of the ceramic material according to claim 1, the ceramic substrate having an upper surface onto which a wafer can be placed; and
   an electrode disposed inside the ceramic substrate.

6. A wafer placement table comprising:
   ceramic substrate made of the ceramic material according to claim 1, the ceramic substrate having an upper surface onto which a wafer can be placed;
   a highly heat-conductive substrate that is attached to a lower surface of the ceramic substrate and that has a higher heat conductivity than the ceramic substrate;
   an electrode that is disposed inside the ceramic substrate, inside the highly heat-conductive substrate, or between the ceramic substrate and the highly heat-conductive substrate; and
   a resistance heating element that is disposed inside the highly heat-conductive substrate and under the electrode.

7. The wafer placement table according to claim 6, wherein the highly heat-conductive substrate contains AlN and YAG.

8. The wafer placement table according to claim 7, wherein the highly heat-conductive substrate contains titanium.

\* \* \* \* \*